United States Patent

Song et al.

[11] Patent Number: 5,824,440
[45] Date of Patent: Oct. 20, 1998

[54] METHOD OF FABRICATING X-RAY MASK

[75] Inventors: Ki-Chang Song; Don-Hee Lee; Young-Sam Jeon; Chil-Keun Park, all of Kyungki-do, Rep. of Korea

[73] Assignee: LG Semicon Co., Ltd., Chungcheongbuk-do, Rep. of Korea

[21] Appl. No.: 877,657

[22] Filed: Jun. 17, 1997

[30] Foreign Application Priority Data

Nov. 30, 1996 [KR] Rep. of Korea ............ 60338/1996

[51] Int. Cl.⁶ ........................................... G03F 9/00
[52] U.S. Cl. .................................. 430/5; 378/35
[58] Field of Search .......................... 430/5, 322, 323, 430/324; 378/34, 35; 438/697

[56] References Cited

U.S. PATENT DOCUMENTS

| 5,413,953 | 5/1995 | Chien et al. | 430/5 |
| 5,482,802 | 1/1996 | Celler et al. | 430/5 |

*Primary Examiner*—S. Rosasco

[57] ABSTRACT

A method of fabricating an X-ray mask includes the steps of forming a membrane on a substrate, forming a first material on the membrane, implanting predetermined ions into the first material, planarizing the membrane by removing a part of the first material and membrane, forming an absorber on the membrane planarized and depositing a second material on the absorber, implanting predetermined ions into the second material, planarizing the absorber by removing a part of the second material and membrane, and patterning the absorber planarized to have a predetermined shape.

13 Claims, 5 Drawing Sheets

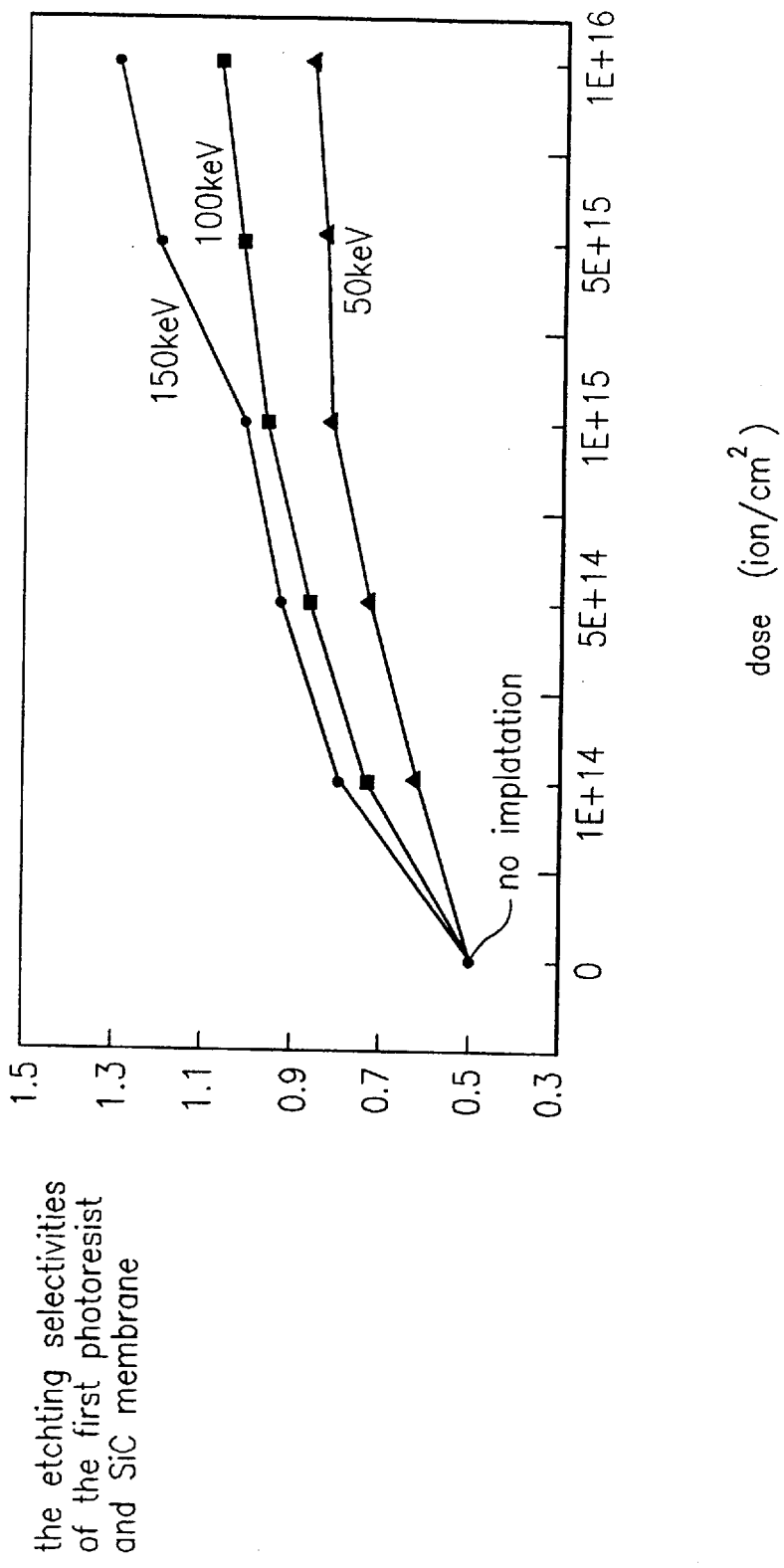

METHOD OF FABRICATING X-RAY MASK

BACKGROUND OF THE INVENTION

1. Field of the Invention

The present invention relates to a mask and, more particularly, to a method of fabricating an X-ray mask.

2. Discussion of Related Art

Masks for X-ray lithography are generally manufactured by two methods: a subtractive technique forming an absorber and then employing the electron beam lithographic technology on an electron beam resist; and an additive technique selectively plating the photoresist that is previously formed, with an absorber.

For the subtractive technique, the surface roughness on the membrane and absorber is a most important factor for producing an X-ray mask. Many studies have been made on the polishing methods to produce a smooth surface on the membrane and absorber of the X-ray mask.

The following description refers to a mask for X-ray lithography according to a prior art with reference to FIG. 1.

On a silicon substrate 1, a membrane 2 is formed from a thin material such as silicon carbide (SiC), silicon nitride (SiN), or diamond. An X-ray absorber 3 is deposited on the membrane 2 by using a thin layer deposition technique such as a sputtering method. The X-ray absorber 3 is formed from one material of tungsten (W), tantalum (Ta) and tungsten titanium (W-Ti).

An electron beam resist (not shown) is deposited on the absorber 3 and patterned to have a designated shape by the e-beam lithography. The absorber 3 is dry-etched by using the patterned electron beam resist as a mask, thus completing a mask.

According to the prior art for manufacturing the X-ray mask, the membrane and X-ray absorber are formed on the silicon substrate and treated with the e-beam lithography. The membrane has a large surface roughness about 50~100 Å, since it is formed from silicon carbide (SiC) having a crystalline structure. Such a rough surface on the membrane may undesirably deteriorate the surface roughness of the absorber deposited on the membrane.

When the surface of the absorber has a large roughness about 50~100 Å, a desired pattern of the absorber cannot have an accuracy due to the scattering of electrons during an electron beam writing.

SUMMARY OF THE INVENTION

Accordingly, the present invention is directed to a method of fabricating an X-ray mask that substantially obviates one or more of the problems due to limitations and disadvantages of the related art.

An object of the present invention is to provide a method of fabricating an X-ray mask to improve its surface roughness.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating an X-ray mask includes the steps of forming a membrane on a substrate, forming a first material on the membrane, implanting designated ions into the first material, planarizing the membrane by removing a part of the first material and membrane, forming an absorber on the membrane planarized and depositing a second material on the absorber, implanting designated ions into the second material, planarizing the absorber by removing a part of the second material and membrane, and patterning the absorber planarized to have a designated shape.

It is to be understood that both the foregoing general description and the following detailed description are exemplary and explanatory and are intended to provide further explanation of the invention as claimed.

According to the present invention, the dry-etching selectivities of the membrane and absorber become equal to those of the first and second photoresists through Ar-ion implantation and dry etching processes. Thus the membrane and absorber have an improved surface roughness, thereby arranging an accurate pattern in an X-ray lithographic process by using a visible ray.

Such an accurate pattern may be obtained by reducing the scattering of electrons during a beam writing on the absorber.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIG. 3 is a graph showing the etching selectivities of first photoresist and silicon carbide membrane according to the condition of ion implantation into the first photoresist.

DETAILED DESCRIPTION OF PREFERRED EMBODIMENT

Reference will now be made in detail to the preferred embodiments of the present invention, examples of which are illustrated in the accompanying drawings.

FIGS. 2a to 2h are cross-sectional view illustrating the process for fabricating an X-ray mask according to the present invention.

Figure 1:
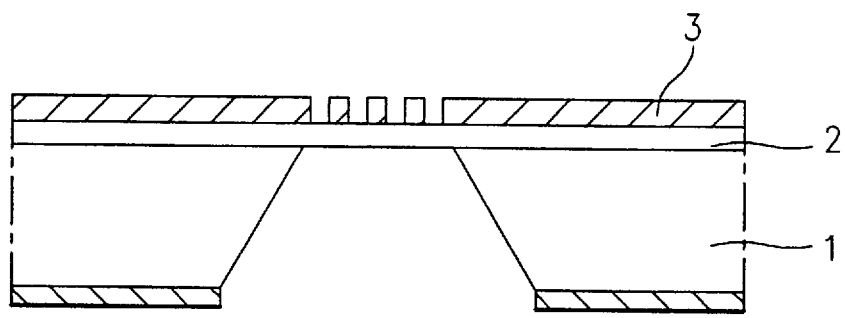
FIG. 1 is a cross-sectional view illustrating the process for fabricating an X-ray mask according to a prior art.
Figure 2A:
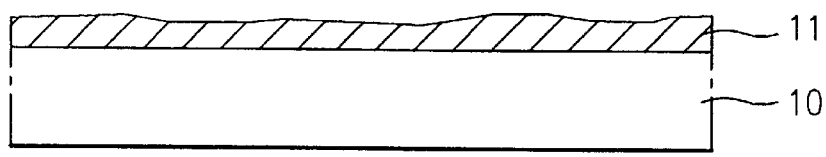
FIGS. 2a to 2h are cross-sectional views illustrating the process for fabricating an X-ray mask according to the present invention.

As shown in FIG. 2a, a membrane 11 is formed from a thin material such as silicon carbide (SiC) on a silicon substrate 10. The surface roughness of the membrane 11 is very large about 50~100 Å.

Figure 2B:
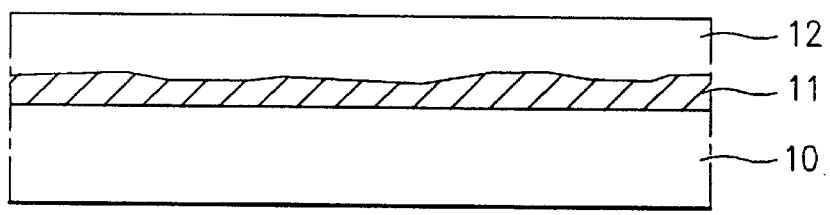

Referring to FIG. 2b, a first photoresist 12 is deposited on the membrane 11. The first photoresist 12 exhibits an etching selectivity with the silicon carbide membrane 11 less than unity. The surface of the first photoresist 12 is planarized by means of a spin coating to produce a smooth surface.

Figure 2C:
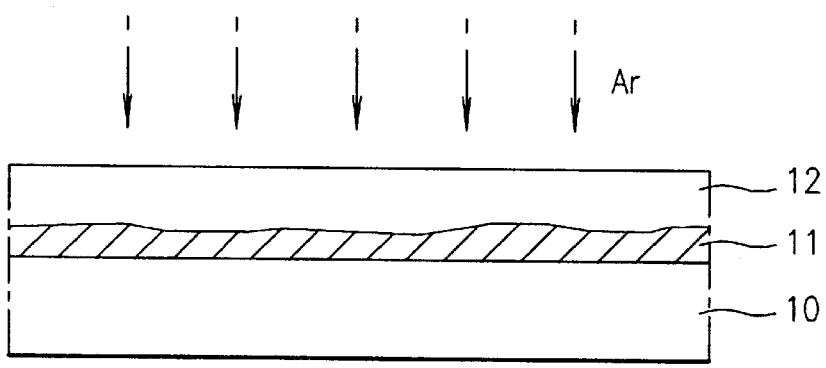

Referring to FIG. 2c, Ar ions are implanted into the surface of the first photoresist 12, thus increasing the etching selectivity of the first photoresist 12 as high as that of the silicon carbide membrane 11.

FIG. 3 is a graph showing the etching selectivities of the first photoresist and silicon carbide membrane according to the condition of ion implantation into the first photoresist. For the first photoresist 12 that has an etching selectivity less than unity prior to an ion-implantation, it is most preferable to implant ions with an energy 100 keV and a dose of $5\times10^{15}$ ion/cm$^2$.

Figure 2D:
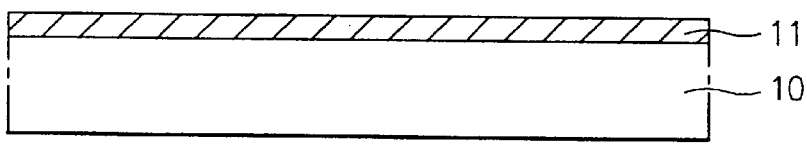

As shown in FIG. 2d, the membrane 11 is planarized to have an improved surface roughness less than 10 Å by dry-etching a part of the first photoresist 12 and membrane 11 through a RIE (Reactive Ion Etching) method. The etching gas is a mixture of $CF_4$ of 90 vol % and Ar of 10 vol %.

Figure 2E:
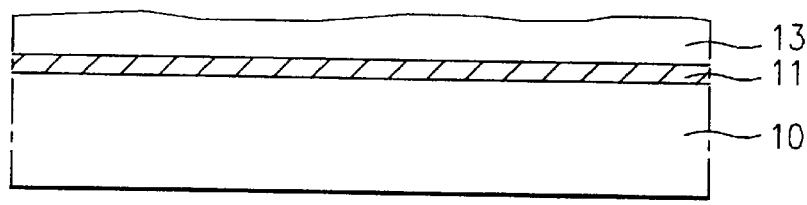

As shown in FIG. 2e, on the membrane 11, an X-ray absorber 13 is formed from one material of tungsten (W), tantalum (Ta) and tungsten titanium (W-Ti) by the thin layer deposition such as a sputtering method. When the X-ray absorber 13 is deposited under a low residual stress and thus has a columnar structure, its surface roughness becomes very large about 50~100 Å.

Figure 2F:
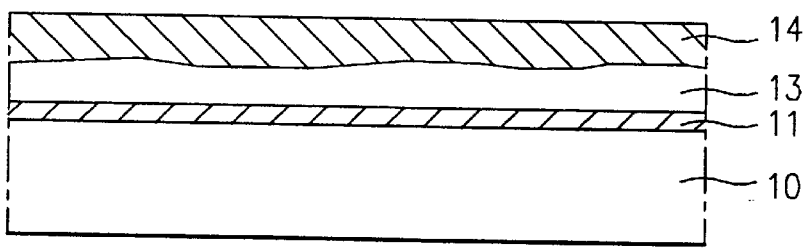

Referring to FIG. 2f, a second photoresist 14 is formed on the x-ray absorber 13 so as to have an etching selectivity with the X-ray absorber 13 below unity. The second photoresist 14 is then treated with a spin coating method to have a planarized surface.

Figure 2G:
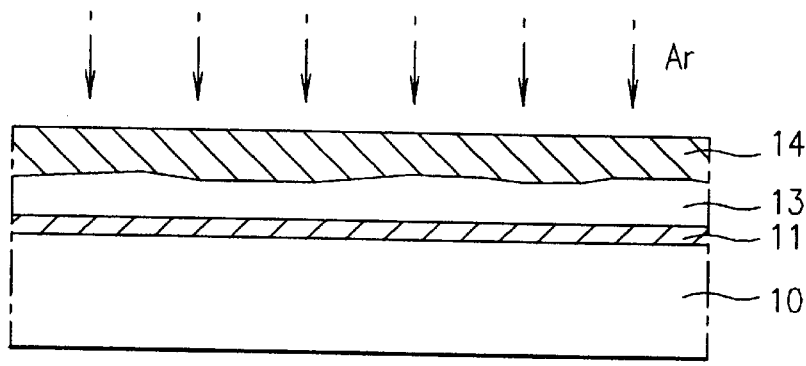

Referring to FIG. 2g, Ar ions are implanted into the surface of the second photoresist 14 to increment the dry-etching selectivity of the second photoresist 14 as high as that of the tungsten X-ray absorber 13.

Figure 4:
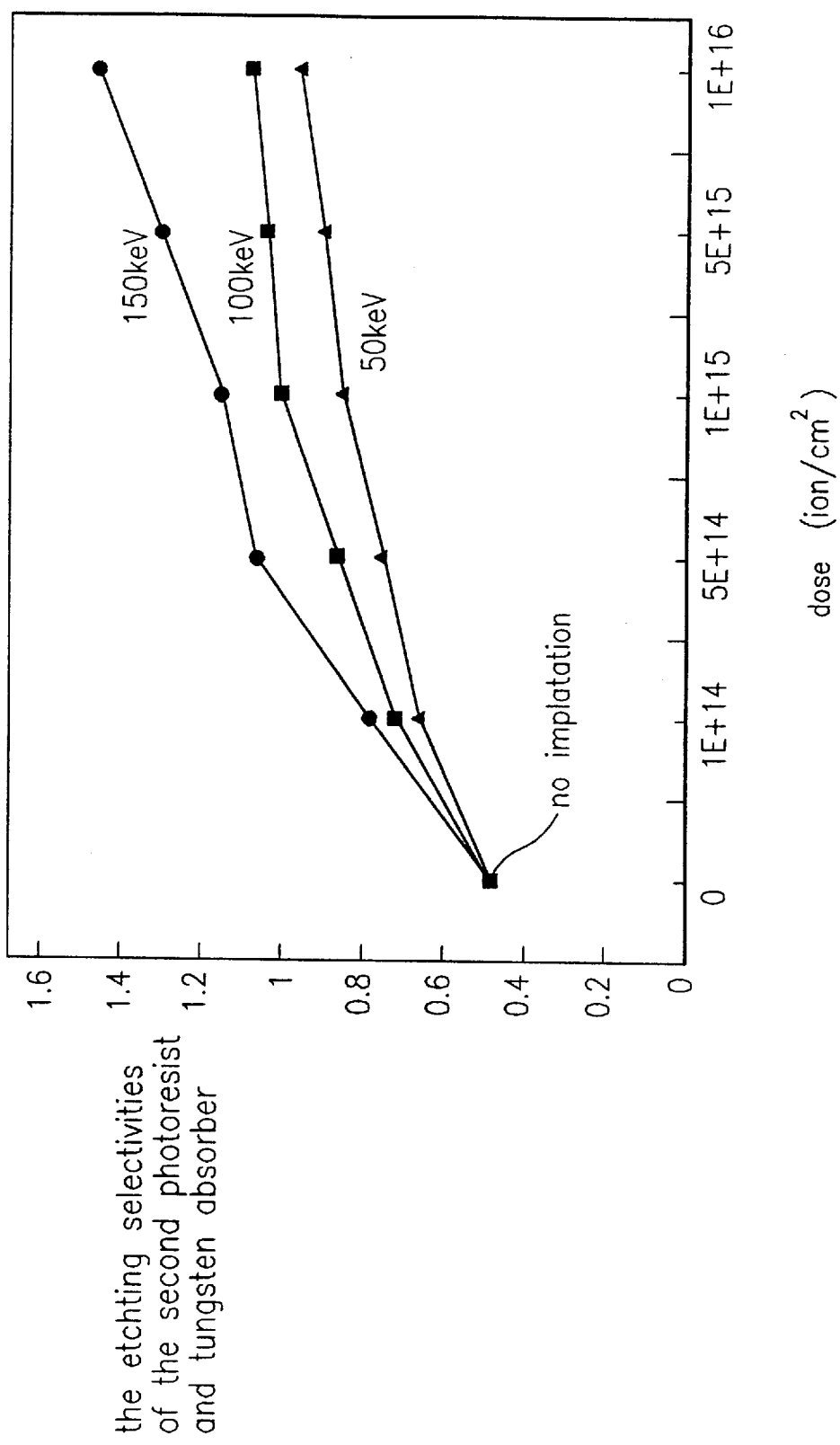
FIG. 4 is a graph showing the etching selectivities of second photoresist and tungsten absorber according to the condition of ion implantation into the second photoresist.

FIG. 4 is a graph showing the etching selectivities of the second photoresist and tungsten absorber according to the condition of ion implantation into the second photoresist. Referring to FIG. 4, for the second photoresist 14 which has an etching selectivity less than unity prior to the ion-implantation, it is most preferable to implant ions with an energy 100 keV and a dose of $1\times10^{15}$ ion/cm$^2$.

Figure 2H:
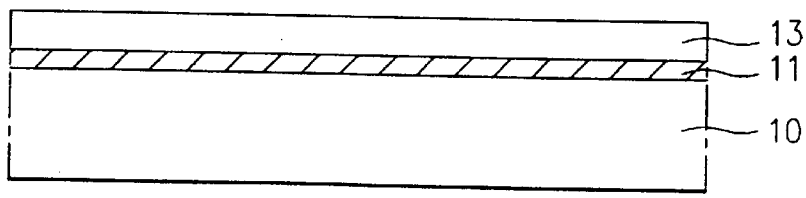

As shown in FIG. 2h, the absorber 13 is planarized to have an improved surface roughness less than 10 Å by dry-etching a part of the second photoresist 14 and X-ray absorber 13 through an RIE (Reactive Ion Etching) method. The etching gas is a mixture of $SF_6$ of 80 vol % and Ar of 20 vol %. The X-ray absorber 13 planarized is patterned to have a designated shape, thus completing an X-ray mask.

It will be apparent to those skilled in the art that various modifications and variations can be made to the method of fabricating an X-ray mask of the present invention without departing from the spirit or scope of the invention. Thus, it is intended that the present invention cover the modifications and variations of this invention provided they come within the scope of the appended claims and their equivalents.

What is claimed is:

1. A method of fabricating an X-ray mask, comprising the steps of:
   (a) forming a membrane on a substrate;
   (b) forming a first material on the membrane;
   (c) implanting predetermined ions into the first material;
   (d) planarizing the membrane by removing a part of the first material and membrane;
   (e) forming an absorber on the membrane planarized and forming a second material on the absorber;
   (f) implanting predetermined ions into the second material;
   (g) planarizing the absorber by removing a part of the second material and membrane; and
   (h) patterning the absorber planarized to have a predetermined shape.

2. The method as defined in claim 1, wherein the first and second materials are photoresist.

3. The method as defined in claim 1, wherein the first material of step (b) has an etching selectivity of less than unity over the membrane.

4. The method as defined in claim 1, wherein the etching selectivity of the first material of step (d) is equal to that of the membrane.

5. The method as defined in claim 1, wherein the second material of step (e) has an etching selectivity of less than unity over the absorber.

6. The method as defined in claim 1, wherein the etching selectivity of the second material of step (g) is equal to that of the absorber.

7. The method as defined in claim 1, wherein the ions implanted into the first and second materials are Ar ions.

8. The method as defined in claim 1, wherein the ions are implanted into the first material under the condition of energy 100 KeV and a dose of $5\times10^5$ ion/cm$^2$.

9. The method as defined in claim 1, wherein the ions are implanted into the second material under the condition of energy 100 KeV and a dose of $1\times10^{15}$ ion/cm$^2$.

10. The method as defined in claim 1, wherein the first and second materials are formed by a spin coating.

11. The method as defined in claim 1, wherein the first and second materials are removed by a dry etching.

12. The method as defined in claim 11, wherein a dry-etching gas for the first material is a mixture of $CF_4$ of 90 vol % and Ar of 10 vol %.

13. The method as defined in claim 11, wherein a dry-etching gas for the second material is a mixture of $SF_6$ of 80 vol % and Ar of 20 vol %.

* * * * *